United States Patent
Lan et al.

(10) Patent No.: US 6,753,552 B1
(45) Date of Patent: Jun. 22, 2004

(54) GROWTH-SELECTIVE STRUCTURE OF LIGHT-EMITTING DIODE

(75) Inventors: Wen-How Lan, Taoyuan (TW);
Lung-Chien Chen, Hsin-Chuang (TW);
Fen-Ren Chien, Yung-Ho (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 10/633,030

(22) Filed: Aug. 2, 2003

(51) Int. Cl.[7] .............................................. H01L 27/15
(52) U.S. Cl. ............................. 257/79; 257/13; 257/88; 257/94; 257/96; 257/103; 257/918; 438/22; 438/24; 438/46; 438/47
(58) Field of Search ............................ 257/13, 79–103, 257/918; 438/22, 24, 25, 28, 29, 46, 47

(56) References Cited

U.S. PATENT DOCUMENTS 6,015,979 A * 1/2000 Sugiura et al. ............... 257/86
6,121,121 A   9/2000 Koide ......................... 438/481

* cited by examiner

*Primary Examiner*—David Nelms
*Assistant Examiner*—Andy Huynh

(57) ABSTRACT

A growth-selective structure of LED is created by growing first and patterning an oxidation layer on a substrate, then applying a lateral-growth technology to form a buffer layer on the oxidation layer selectively, and an n-GaN layer, an active layer, and a p-GaN layer on the buffer layer one after another.

7 Claims, 6 Drawing Sheets

GROWTH-SELECTIVE STRUCTURE OF LIGHT-EMITTING DIODE

BACKGROUND OF THE INVENTION

1. Field of the Invention

The present invention relates generally to the field of Light-Emitting Diodes (LEDs), and particularly to an LED structure that employs lateral growth technology to selectively grow a Gallium-nitride (GaN) epitaxial layer.

2. The Prior Arts

GaN-based compound semiconductors applied in light-emitting diodes (LEDs) or laser diodes (LDs) are widely known, which are generally cultivated and grown on a sapphire substrate. However, the threading dislocation density of a GaN compound grown on a sapphire substrate is as high as $1 \times 10^9$ units/cm$^2$ because the lattice mismatch between GaN and sapphire is as great as about 16% that could badly affect the reliability and performance of a light-emitting device.

To eliminate the defect, Taiwan Patent No. 501289 teaches an epitaxial lateral over-growing (ELO) method to improve the defect density in vertical by the mentioned lattice mismatch phenomenon.

Unfortunately, it is rather difficult to cut an as-grown chip into grains in due shapes with a diamond knife owing to the extreme hardness of the GaN compounds. Hence, a grinding process for thinning the chip to approximately 85 μm and an extra isolation process for lowering the rate of defective product are inevitable.

SUMMARY OF THE INVENTION

A primary object of the present invention is to grow a buffer layer on a patterned silicon dioxide layer of an epitaxially grown LED structure by adjusting the mixing ratio between a growing gas and an etching gas for control of lateral growth, without needing any extra isolation process.

Another object of the present invention is to simplify the growing process of LED by means of a lateral growth technology and to obtain a lower stray capacitance for raising the external quantum efficiency.

For more detailed information regarding advantages or features of the present invention, at least an example of preferred embodiment will be described below with reference to the annexed drawings.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

Figure 1:
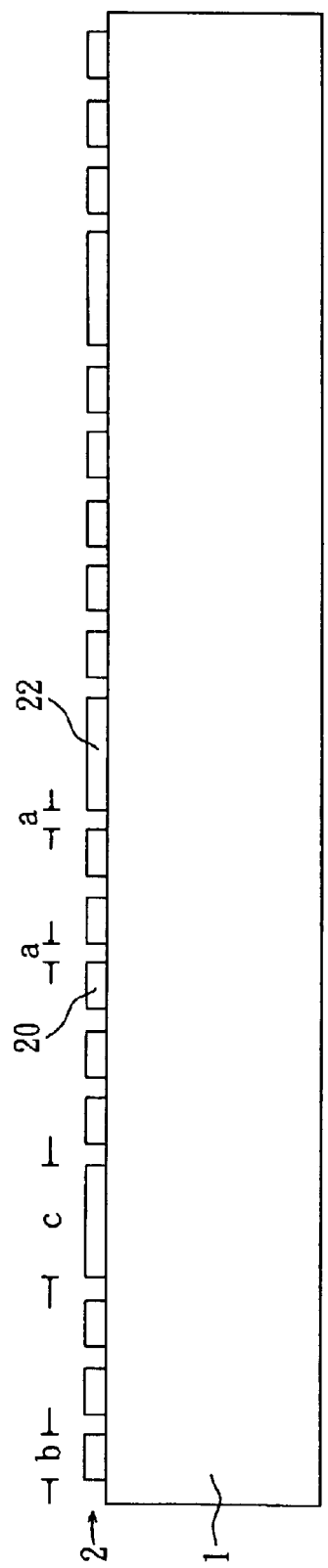
FIG. 1 shows schematically an oxidation layer of a growth-selective structure of LED according to an embodiment of the present invention.

FIG. 1 shows schematically an oxidation layer of a growth-selective structure of light emitting diode (LED) according to an embodiment of the present invention. As show in FIG. 1, a substrate 1, which could be any of sapphire, SiC, Si, GaAs, LiAlO$_2$, LiGaO$_2$, or AlN, is put in a MOCVD (Metal Organic Chemical Vapor Deposition) system for depositing a thin film of silicon dioxide to form a patterned oxidation layer 2 under the circumstance of 920° C. water vapor. A plurality of isolated blocks 20, 22 is thus formed and spaced respectively by a gap (a), in which each isolated block 20, 22 has either a larger lateral width (c) in 30 μm up or a smaller lateral width (b) in 5 μm down, and the gap (a) is about 8–12 μm wide, preferably 10 μm.

Figure 2:
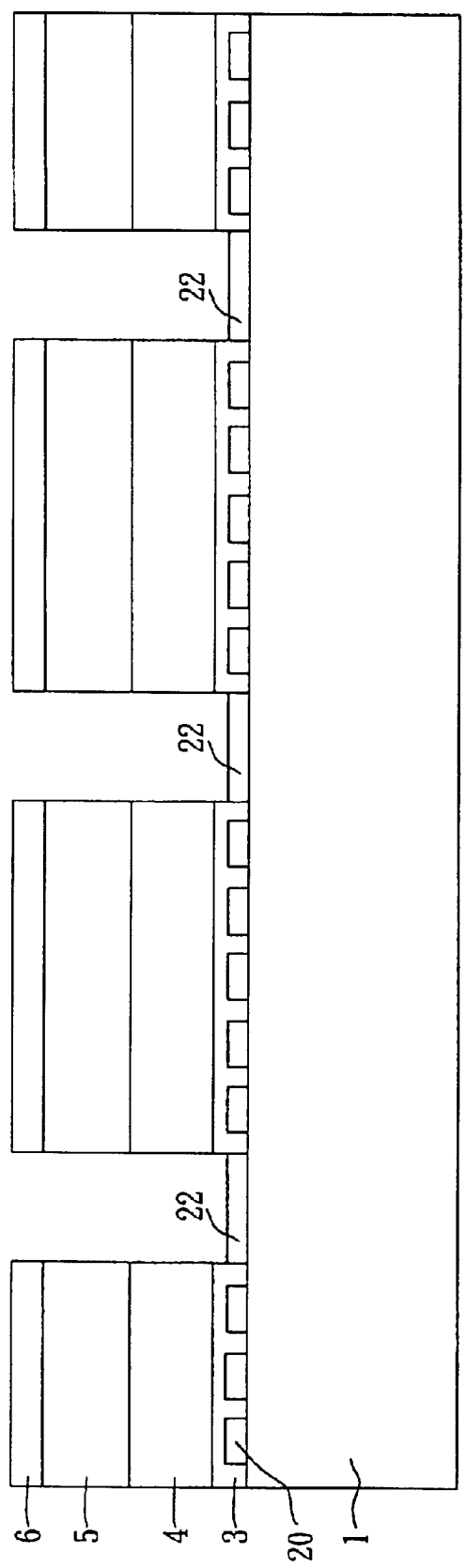
FIG. 2 shows schematically a buffer layer, an n-GaN layer, an active layer, and a p-GaN layer of the growth-selective structure of LED according to the embodiment of the present invention.

FIG. 2 shows schematically a buffer layer, an n-GaN layer, an active layer, and a p-GaN layer of a growth-selective structure of LED according to the embodiment of the present invention. A lateral-growth technology is applied through proper adjustment of the mixing ratio among hydrogen (H2), ammonia (NH$_3$), and trimethyl gallium (TMG), the main factor to affect the selective growth direction, to thereby etch away undesired growth of GaN compound on the oxidation layer 2 of the relatively smaller lateral width (b) of a plurality of neighboring isolated blocks 20 to form a unified continuous GaN buffer layer 3. However, this is not the case for the isolated block 22 having relatively larger lateral width (c) because its growth is constrained by the lateral-growth technology. Then, an n-GaN layer 4, an active layer 5, and a p-GaN layer 6 are formed on the buffer layer 3 one after another, in which the material of respective layers includes a silicon-doped GaN compound of III–V group for the n-GaN layer 4; a GaN compound of III–V group for the active layer 5; and a magnesium-doped GaN compound of III–V group for the p-GaN layer 6.

Figure 3:
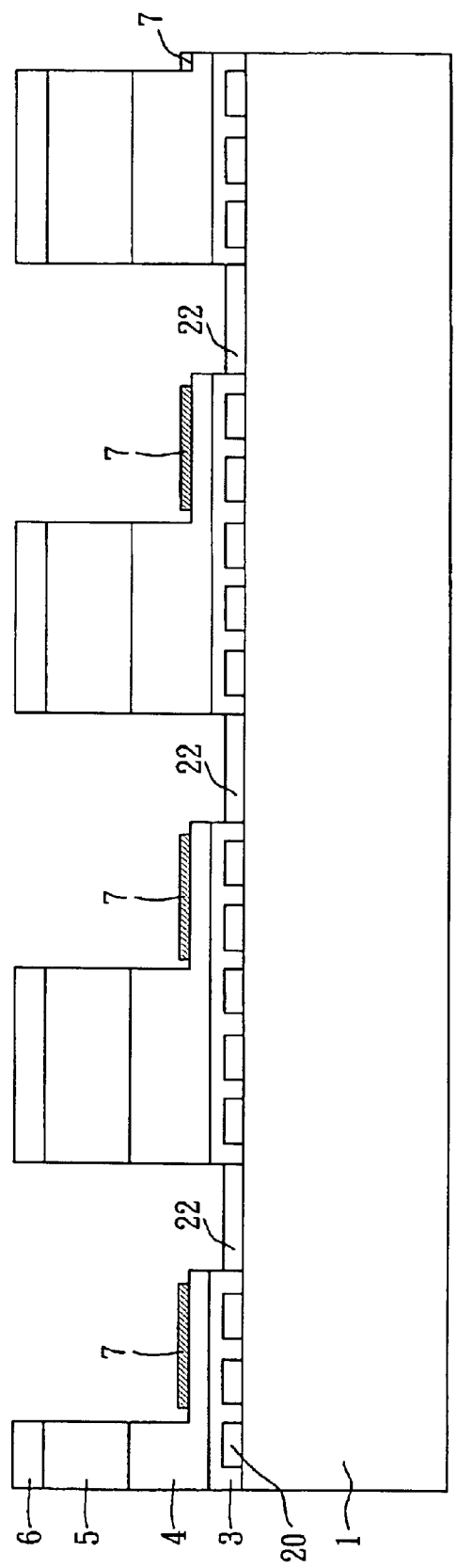
FIG. 3 shows schematically a p-GaN layer, an active layer, and an n-GaN layer in an etched portion of a growth-selective structure of LED according to the embodiment of the present invention.

FIG. 3 shows schematically a p-GaN layer, an active layer, and an n-GaN layer in an etched portion of a growth-selective structure of LED according to the embodiment of the present invention. As shown in FIG. 3, after the p-GaN layer 6 in FIG. 2 has been formed, a dry etching technology is applied to etch away a part of the p-GaN layer 6, the active layer 5, and the n-GaN layer 4 to hence form an outwardly exposed area to be deposited with titanium/aluminum (Ti/Al) on its surface to thereby form an n-ohmic-contact electrode 7.

Figure 4:
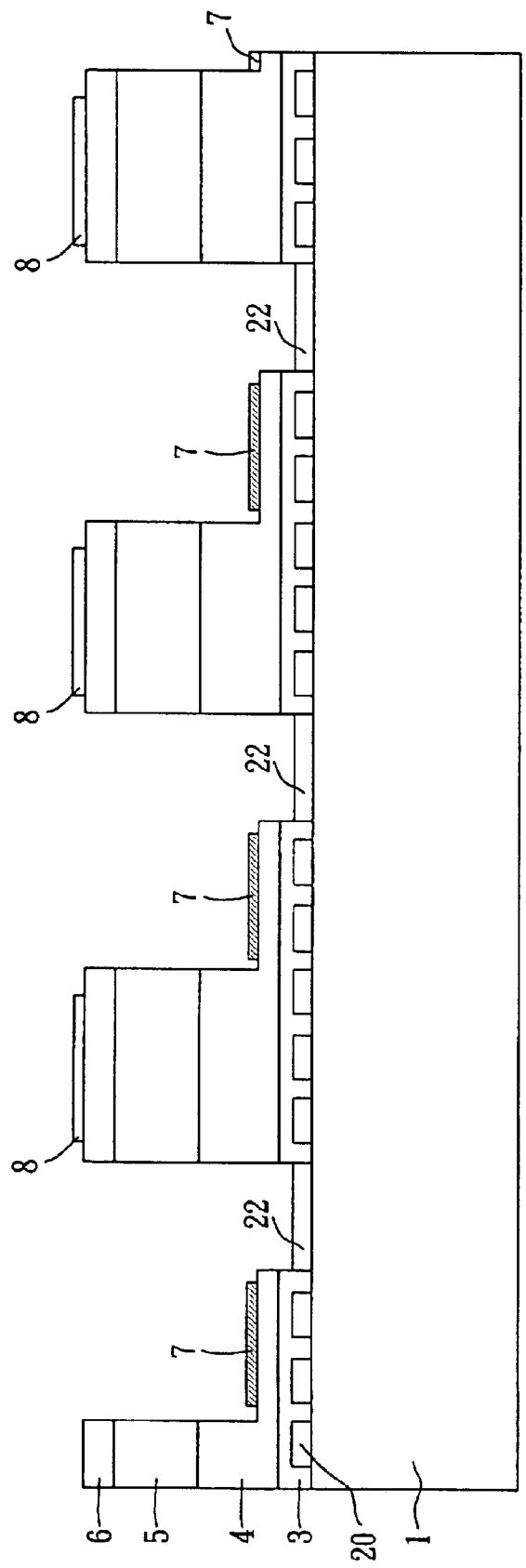
FIG. 4 shows schematically a p-ohmic-contact electrode of a growth-selective structure of LED according to the embodiment of the present invention.

FIG. 4 shows schematically a p-ohmic-contact electrode of a growth-selective structure of LED according to the embodiment of the present invention. As shown in FIG. 4, for the sake of raising the light-emitting efficiency, a very thin p-ohmic-contact electrode 8 is formed, usually 50 Å–200 Å, preferably 100 Å thick, by depositing Ni/AuBe on the p-GaN layer 6.

Figure 5:
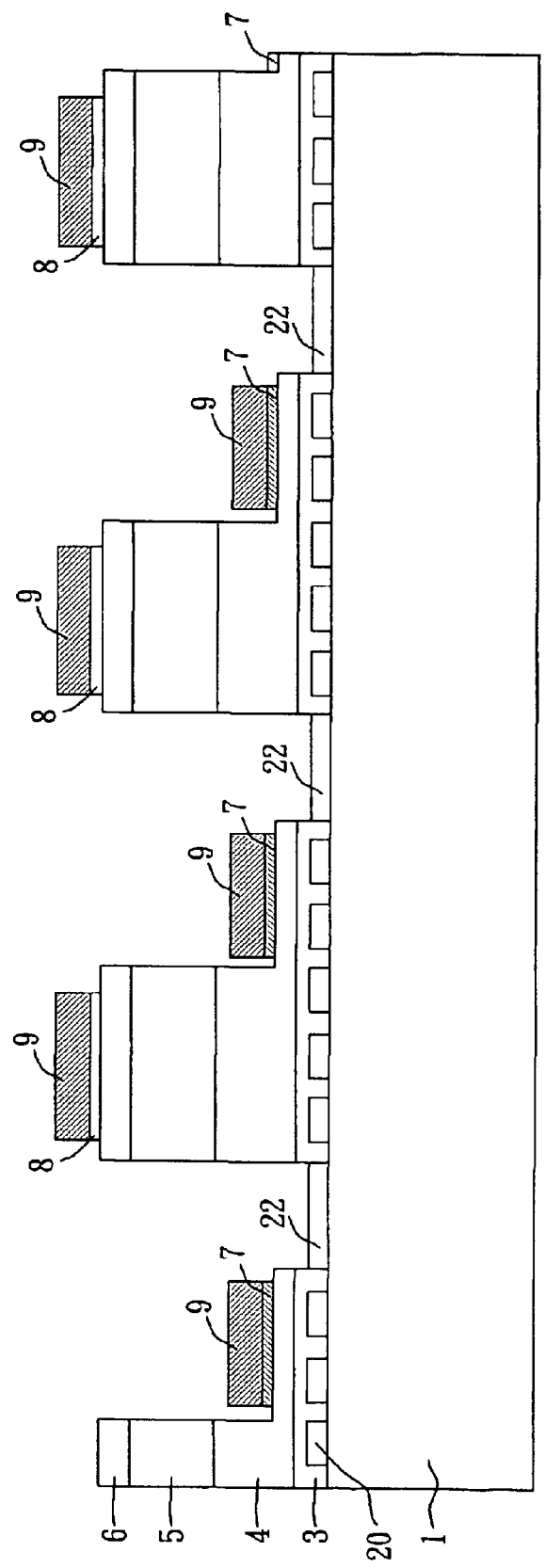
FIG. 5 shows schematically a plurality of soldering pads on a growth-selective structure of LED according to the embodiment of the present invention.

FIG. 5 shows schematically a plurality of soldering pads on a growth-selective structure of LED according to the embodiment of the present invention. As shown in FIG. 5, a soldering pad 9 is formed on the n- and the P-ohmic-contact electrode 7, 8 respectively, and electrically connected with a lead wire. The soldering pad 9 is substantially a stack layer in 3–1 μm, preferably 2 μm thick, formed by overlapping 5 metallic layers (Ti/Pt/Al/Ti/Au) together. The grain structure of the present invention is thus completed according to foregoing steps.

Figure 6:
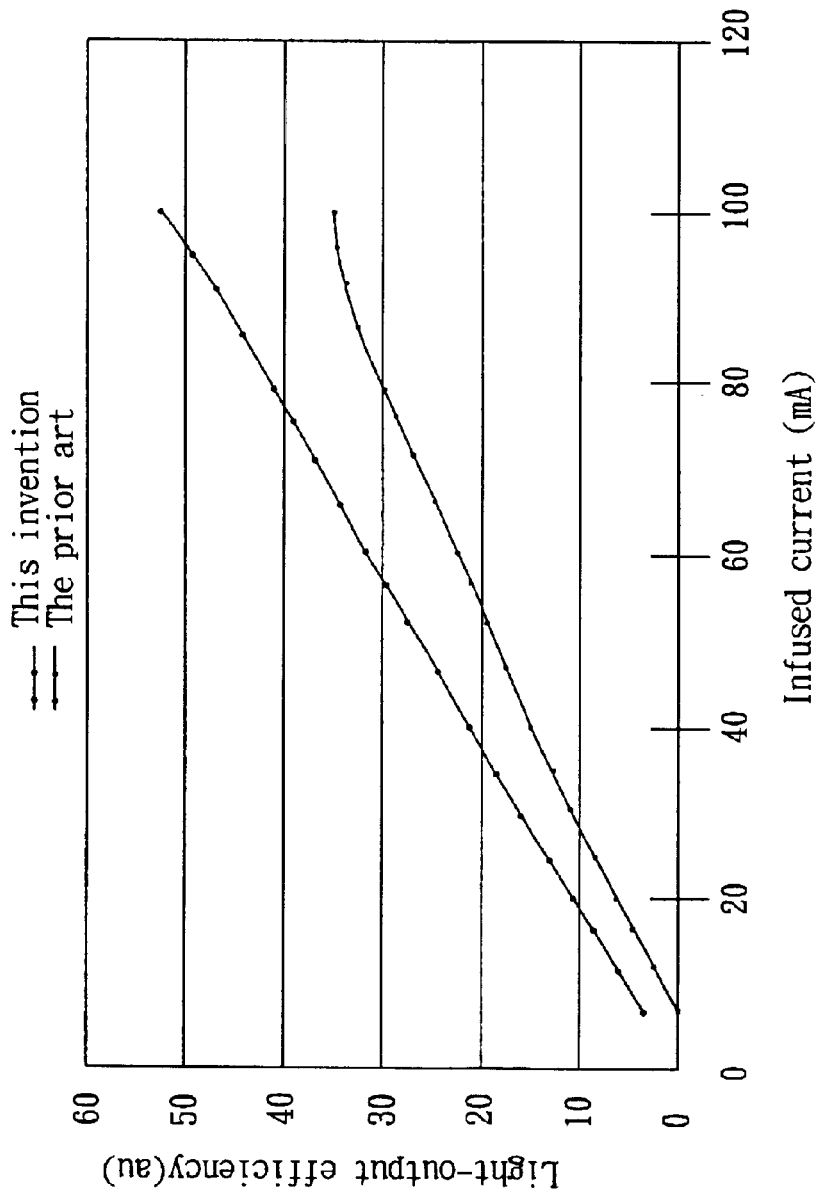
FIG. 6 is a plotted diagram comparing the light-emission efficiency of a growth-selective structure of LED according to the embodiment of the present invention with a prior art.

FIG. 6 is a plotted diagram comparing the light-emission efficiency of a growth-selective structure of LED according to the embodiment of the present invention with a prior art. As shown in FIG. 6, the light-emitting efficiency (au/mA) of the present invention is obviously higher than that of the prior art.

In the above described, at least one preferred embodiment has been described in detail with reference to the drawings annexed, and it is apparent that numerous changes or modifications may be made without departing from the true spirit and scope thereof, as set forth in the claims below.

What is claimed is:

1. A growth-selective structure of light-emitting diode (LED), comprising:

a nonconductive substrate;

an oxidation layer comprising a patterned silicon dioxide deposited on the substrate to form a plurality of isolated blocks having a large width greater than 30 $\mu$m and a small width smaller than 5 $\mu$m respectively, the blocks being separated by a gap of 8–12 $\mu$m;

a buffer layer of GaN gallium nitride) III–V group deposited on the oxidation layer of the isolated blocks having the smaller width to form a unified body;

an n-GaN layer formed on the buffer layer;

an active layer of GaN III–V group formed on the n-GaN layer;

a p-GaN layer formed on the active layer;

an n-ohmic-contact electrode formed in an n-electrode forming section on the n-GaN layer, the n-electrode forming section being formed by etching the p-GaN layer, the active layer, and the n-GaN layer to have the n-GaN layer exposed, then, a Ti/Al metal being deposited on the n-GaN layer for forming the n-ohmic-contact electrode;

a p-ohmic-contact electrode made of Ni/AuBe formed on the p-GaN layer, having a thickness of 50–200 Å; and a plurality of soldering pads formed on the p- and n-ohmic-contact electrode, the soldering pad being substantially a stack layer in 3–1 $\mu$m thick, formed by overlapping 5 metallic layers (Ti/Pt/Al/Ti/Au) together.

2. The growth-selective structure of LED according to claim 1, wherein a lateral-growth technology applied is based on adjustment of the mixing ratio among hydrogen ($H_2$), ammonia ($NH_3$), and trimethyl gallium (TMG).

3. The growth-selective structure of LED according to claim 1, wherein the thickness of the soldering pad is 2 $\mu$m.

4. The growth-selective structure of LED according to claim 1, wherein the thickness of the p-ohmic-contact electrode is 100 Å.

5. The growth-selective structure of LED according to claim 1, wherein the gap is 10 $\mu$m.

6. The growth-selective structure of LED according to claim 1, wherein the material of the n-layer is a silicon-doped GaN compound of III–V group.

7. The growth-selective structure of LED according to claim 1, wherein the material of the p-GaN layer is a magnesium-doped GaN compound of III–V group.

* * * * *